(12) United States Patent
Zhu et al.

(10) Patent No.: US 7,876,098 B2
(45) Date of Patent: Jan. 25, 2011

(54) VOLUME COIL FOR MRI SYSTEM

(75) Inventors: Hua Bin Zhu, Shenzhen (CN); Yan Hong Chen, Shenzhen (CN); Hai Ning Wang, Shenzhen (CN); Jian Min Wang, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 118 days.

(21) Appl. No.: 12/394,705

(22) Filed: Feb. 27, 2009

(65) Prior Publication Data

US 2009/0243612 A1   Oct. 1, 2009

(30) Foreign Application Priority Data

Feb. 29, 2008   (CN)   .................. 2008 1 0006468

(51) Int. Cl.
G01V 3/00   (2006.01)
(52) U.S. Cl. ...................... 324/318; 324/322
(58) Field of Classification Search ................ 324/318, 324/322
See application file for complete search history.

(56) References Cited

U.S. PATENT DOCUMENTS

| | | | | |
|---|---|---|---|---|
| 5,489,847 A * | 2/1996 | Nabeshima et al. | ......... | 324/318 |
| 6,879,159 B2 * | 4/2005 | Yoshida | ....................... | 324/318 |
| 7,248,051 B2 * | 7/2007 | Wang et al. | .................. | 324/322 |
| 7,725,159 B2 * | 5/2010 | Guan et al. | .................. | 600/422 |

* cited by examiner

*Primary Examiner*—Louis M Arana
(74) *Attorney, Agent, or Firm*—Schiff Hardin LLP

(57) ABSTRACT

A volume coil for a magnetic resonance imaging system is composed of a number of coil units. In the coil, there are overlapped parts between two adjacent ones of the coil units for eliminating coupling between these two adjacent coil units. Two next-adjacent ones of the coil units, which are separated from each other by one coil unit, are each provided with an inductor, and these two inductors are coupled with each other for eliminating coupling between these two next-adjacent coil units. All coil units are collected on one axial end face of the coil. Two coil units in the coil that are neither adjacent coil units nor next-adjacent coil units are connected with each other on the end face by a capacitance circuit or a inductance circuit for eliminating the coupling between these two coil units that are neither adjacent coil units nor next-adjacent coil units. The coupling among the various coil units is relatively thoroughly eliminated, and the signal-to-noise ratio of the signal received by the coil is increased.

8 Claims, 4 Drawing Sheets

VOLUME COIL FOR MRI SYSTEM

BACKGROUND OF THE INVENTION

1. Field of the Invention

The present invention relates to decoupling technology for coils in a magnetic resonance imaging system and, particularly, to a coil for a magnetic resonance imaging system.

2. Description of the Prior Art

Magnetic resonance imaging (MRI) systems have important applications in fields such as clinic diagnosis etc. Dependent on the intensities of the main magnets in MRI systems, the MRI systems can be classified roughly into three major categories of low field (less than 0.3 T), middle field (0.3 T to 1.0 T) and high field (larger that 1.0 T). Correspondingly, radio frequency signal receiving coils can also be classified into low field receiving coils, middle field receiving coils and high field receiving coils. In addition, according to the shapes of receiving coils, the receiving coils can be classified into volume coils and surface coils. Generally speaking, a volume coil can accommodate a part of a human body to be scanned for imaging (for example, a head or a limb) into the coil; while a surface coil is for placing on the surface of a part of a human body to be scanned for imaging, such as spine, eye, abdomen, etc.

With the development of receiving coil technology, most of the receiving coils composed of a number of coil units use the phased-array technology, so the coils using the phased-array technology can be referred to as phased-array coils. Furthermore, with the development of receiving coil technology, the number of the coil units in the phased-array coils is continuously increasing, and the signal-to-noise ratio (SNR) and uniformity of the image obtained thereby are significantly improved. Negative effects associated therewith, however, are that the coupling level among various coil units is also increased, the modes of coupling are becoming more and more complicated, and the number of coil unit pairs requiring decoupling treatments is becoming larger and larger. If the coil units are inadequately decoupled, it will produce negative influences on the noise matching of the preamplifier relevant to the noises between the coil units, thus putting the signal-to-noise ratio of the image obtained from the coil under considerable adverse influence.

The conventional modes for decoupling coils can be generally classified into the following types.

The first mode is to have partial overlap between two adjacent coil units. In FIG. 1, the coil units 101 and 102, 102 and 103, 103 and 104, 104 and 105, 105 and 106, 106 and 101 are respectively adjacent to each other, and there is an overlapped part between every two adjacent coil units. Taking the adjacent coil units 101 and 102 as an example, due to the existence of the overlapped part, it makes the net magnetic field generated by the coil unit 101 in the coil unit 102 be zero, therefore the magnetic coupling is also zero, so as to achieve the decoupling, and vice versa. If this mode is used, each of the coil units can be independent from each other, and it is not necessary for two coil units to have electrical connection in a circuit. Currently, in MRI systems with high field (generally horizontal field), most receiving coils use this mode. This mode can produce good decoupling effects to adjacent coil units, however, since there is no way to make those non-adjacent coil units partially overlapped, this mode is not suitable for the decoupling between non-adjacent coil units.

The second mode is to decouple by a pre-amplifier decoupling method. In the surface coils, the coupling between non-adjacent coil units is generally weak, and it can be decoupled by way of the preamplifier decoupling method, and it is not necessary to employ a decoupling structure design in the coil. However, in the volume coils the coupling between non-adjacent coil units is generally stronger, it is far from enough by only relying on the preamplifier decoupling. It is thus necessary to introduce a dedicated decoupling configuration to eliminate the coupling between the non-adjacent coil units.

The third mode is to introduce a capacitance circuit or an inductance circuit into the electric circuit to achieve decoupling. According to the different polarities of inductive electric potential, a corresponding capacitance circuit or inductance circuit is introduced to counteract the generated inductive electric potential, so as to achieve the purpose of decoupling. Upon using this mode, it is necessary to establish electric circuit connections among various coil units to be decoupled, otherwise the decoupling capacitors or inductors cannot be introduced. Currently in the middle and low field (generally vertical field) MRI systems, since basically all coil units (for example, loop coils or saddle coils) have electrical connections and the number of coil units is relatively small, it is easy to introduce a capacitance or inductance circuit. Moreover, in the low and middle fields, the frequency of RF signals is not high, various RF effects such as loss etc. can be ignored, therefore, this mode is widely used in the MRI systems of middle and low fields.

However, for the high field (usually horizontal field) receiving coils, between the coil units other than the adjacent coil units there are usually no connection points suitable for connecting a capacitance or inductance circuit, if a capacitance or inductance circuit is introduced between two coil units spaced relatively far away (for example, between the coil unit 101 and the coil unit 104 shown in FIG. 1), it will certainly bring about some loss and thereby reduce the signal-to-noise ratio. In the case of the number of coil units being large, if the decoupling is carried out entirely by using capacitance circuits or inductance circuits, then it is necessary to add many additional decoupling circuits, and these decoupling circuits will produce considerable adverse influence on the matching of the corresponding coil units. Therefore, after the decoupling it is necessary to perform matching and this matching will certainly affect the original decoupling treatment. Further decoupling then is necessary after the matching. Therefore, in this case, it is necessary to carry out repeated decoupling and matching, and the finally obtained coil is certainly a complicated and unstable coil.

In summary, for the volume coils of high field (generally horizontal field) MRI systems that are composed of a number of coil units, the above first mode can be used to perform decoupling between adjacent coil units of this type of coil, but there is no solution with good decoupling effect for non-adjacent coil units.

SUMMARY OF THE INVENTION

An object of the present invention is to provide a volume coil for a magnetic resonance imaging system, and that allows an effective decoupling treatment for the non-adjacent coil units in the volume coil to be performed, and to make such a volume coil stable.

This object is achieved in accordance with the present invention by a volume coil for a magnetic resonance imaging system, composed of a number of coil units, wherein two adjacent ones of the coil units have an overlapped part that eliminates the coupling between these two adjacent coil units, two next-adjacent coil units (meaning two coil units that are separated by one coil unit therebetween) are each provided with an inductor, and these two inductors are coupled with each other for eliminating the coupling between these two next-adjacent coil units. All coil units are combined at one axial end face of the coil. Two coil units in the coil that are neither adjacent coil units nor next-adjacent coil units are connected with each other at the end face. These latter two coil units are connected with a capacitance circuit or an inductance circuit that eliminates coupling between those two coil units that are neither adjacent coil units nor next-adjacent coil units.

As noted above, the term "next-adjacent coil units" means two coil units separated by another coil unit therebetween. The two coil units that are neither adjacent cell units nor next-adjacent coil units means two coil units separated by two or more coil units therebetween.

The inductor is located in its respective coil unit on one edge thereof, which edge is closest to the next-adjacent coil unit.

In one embodiment, the capacitance circuit or inductance circuit is connected in series between the two coil units that are neither adjacent coil units nor next-adjacent coil units.

In one embodiment, the capacitance circuit is a capacitor, or the inductance circuit is an inductor.

The coil can further have a sheet at the end face, the sheet being made of a diamagnetic material.

The diamagnetic material is copper, gold, silver or lead.

The sheet is in a circular shape, and is located in the central part of said end face. Its area is approximately one half of the area of the end face.

According to the present invention, for the adjacent coil units, the existing decoupling mode of the two coil units overlapping each other is used. For the next-adjacent coil units, the decoupling mode of adding inductors therein is used. For the coil units that are neither adjacent cell units nor next-adjacent cell units, the decoupling mode is used in which connection points are formed on one end face so as to connect the capacitance circuits or inductance circuits. The coupling between the coil units in the coil according to the invention is eliminated relatively thoroughly, so as to improve the signal-to-noise ratio of the signals received by the coil. Moreover, the present invention provides inductors in the next-adjacent coil units, and this structure is much simpler than the third mode in the prior art, and has virtually no influence on the matching of the coil. In addition, the present invention neatly collects these coil units at one end face of the coil, thus forming connection points that facilitate the connection of capacitance circuits or inductance circuits. The effects of such connection points are equivalent to the connection points between the adjacent coil units in the prior art, which can be connected into the capacitance circuits or inductance circuits without adverse influence on the matching of the coil units, so no further matching is needed, thus making the coil stable. The present invention can further include a sheet made of a diamagnetic material, so as to improve the signal-to-noise ratio at the end of the coil. Furthermore, the present invention can additionally make use of the preamplifier decoupling technology in the prior art for non-adjacent coil units, and due to the special structure and the decoupling effectiveness of the coil of the present invention, it can significantly eliminate the influence of the coupling among coil units in the matching of the coil, thus allowing the preamplifier to operate with an optimal noise coefficient, so as to obtain a very good signal-to-noise ratio.

DESCRIPTION OF THE PREFERRED EMBODIMENTS

In the following embodiments, a volume coil composed of six coil units is used as an example for the detailed description. The present invention is not limited in this example, and can have more than six coil units, for example, seven coil units, eight coil units and twelve coil units, and so on.

In the embodiments of the present invention, in order to achieve as much decoupling of the volume coil in a high field as possible, mainly three decoupling modes are used simultaneously.

Figure 1:
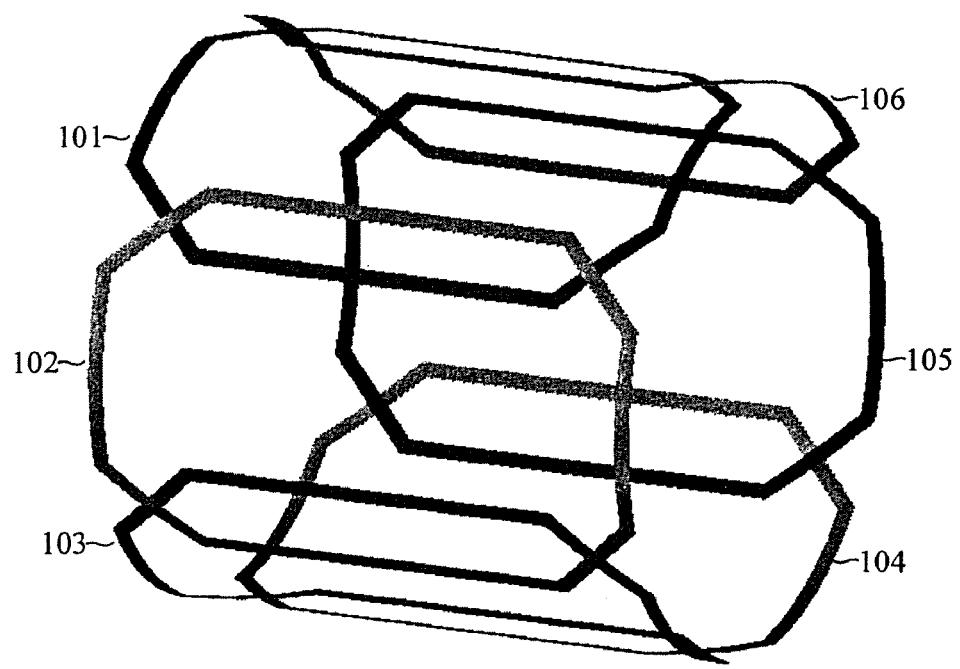
FIG. 1 is a schematic view of a mode in the prior art for achieving decoupling between adjacent coil units by partially overlapping them.

The first decoupling mode used in the coil is the mode wherein two adjacent coil units partially overlap each other for decoupling, that is, an overlapped portion exists between two adjacent coil units so as to eliminate the coupling between these two adjacent coil units. As shown in FIG. 1, in the coil using the first decoupling mode, there are overlapped parts between all adjacent coil units. Since this mode is the same as the first mode in the prior art, it will not be described here redundantly. Similar to the first decoupling mode in the prior art, by using the first decoupling mode in the embodiment of the present invention, the coupling between adjacent coil units can be eliminated.

The second decoupling mode used in the embodiment of the present invention is to use inductive coupling for two next-adjacent coil units. The next-adjacent coil units are two coil units that are separated by a third coil unit therebetween. For example, in FIG. 1, the coil units 101 and 103, 102 and 104, 103 and 105, 104 and 106, 105 and 101, 106 and 102 are all next-adjacent coil units. For any two next-adjacent coil units in the coil, in the embodiment of the present invention an inductor is provided in each of the respective two next-adjacent coil units. These two inductors couple with each other. Since in each next-adjacent coil unit, the intensity of the inductive electric potential coupled by the inductor is equal in size to the inductive electric potential between the two next-adjacent coil units, but opposite in direction, the inductive electric potential coupled by the inductors counteracts the inductive electric potential between the next-adjacent coil units, thus cancelling the coupling between these two next-adjacent coil units.

Figure 2:
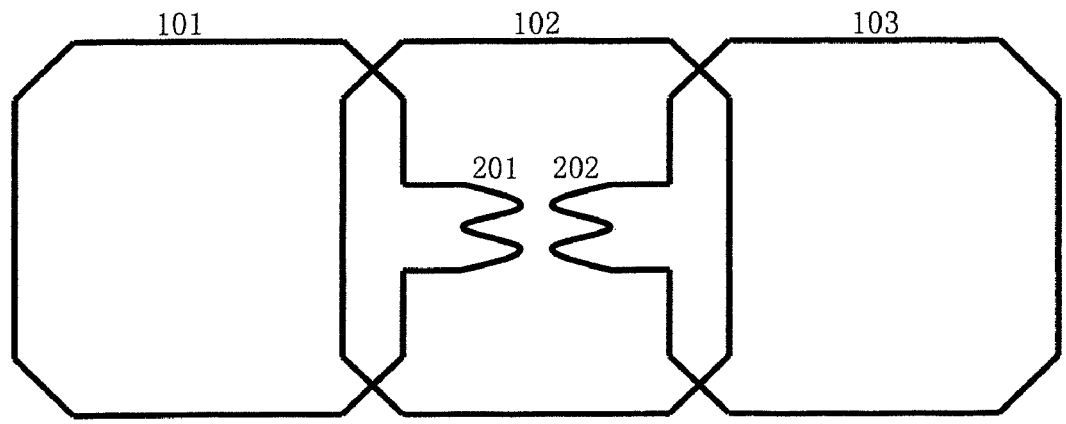
FIG. 2 is a schematic view of the decoupling structure between next-adjacent coil units in an embodiment of the present invention.

FIG. 2 shows an exploded plane view of three coil units 101, 102 and 103 in FIG. 1, wherein the coil units 101 and 103 are the next-adjacent coil units, and an inductor 201 and an inductor 202 are respectively arranged in these two next-adjacent coil units 101 and 103. The arrangement of the inductors 201 and 202 makes them capable of coupling with each other, thereby each generating an inductive electric potential coupled by the inductor. In the coil unit 101, the inductive electric potential generated in the inductor 201 due to the coupling with the inductor 202, is equal to the inductive electric potential generated in the coil unit 103 due to the coupling with the coil unit 101, and they are opposite in direction, therefore they cancel each other. In other words, the inductive electric potential generated in the inductor 201 due to the coupling with the inductor 202 cancels the inductive electric potential generated in the coil unit 101 due to the coupling with the next-adjacent coil unit 103, and vice versa. Namely, the inductive electric potential generated in the inductor 202 due to the coupling with the inductor 201 cancels the inductive electric potential generated in the coil unit 103 due to the coupling with the next-adjacent coil unit 101.

In FIG. 2, the inductor 201 and the inductor 202 are located at the closest edges of the coil unit 101 and the coil unit 103, to facilitate their assembling. However, those skilled in the art will recognize that the inductor 201 can also be arranged at other edges of the coil unit 101, and similarly, the inductor 202 can be arranged at other edges of the coil unit 103, as long as the inductor 201 is made to couple with the inductor 202.

It should be noted that, for clarity, FIG. 2 only shows the inductors 201 and 202 for performing decoupling of the next-adjacent coil units 101 and 103, with the other inductors not being shown. For example, in the coil unit 101, another inductor can also be arranged to perform decoupling between coil unit 101 and another next-adjacent unit 105.

The third mode used in the embodiment of the present invention is to collect at one axial end of the coil (for example, the right end of the coil units 101-106 in FIG. 1), all coil units in the coil, so as to hold them together in the end face. The embodiment of the present invention provides connection points at close distances capable of connecting capacitance circuits or inductance circuits for the coil units that are not adjacent themselves, so as to provide connection between two coil units that are neither adjacent coil units nor next-adjacent coil units, and a capacitance circuit or an inductance circuit is connected therein. Particular connection modes for the capacitance circuit and inductance circuit to be connected to the connection points are the same as those in the prior art, and they will not be described here redundantly. In this way, the capacitance circuit or inductance circuit can be used to eliminate the coupling between two coil units that are neither adjacent coil units nor next-adjacent coil units. Moreover, in comparison with the third mode in the prior art, the third mode of the embodiment of the present invention provides connection points of close distances, so their effects are equivalent to that of those connection points of adjacent coil units in the prior art, and they can avoid extra circuit loss, so as to improve the signal-to-noise ratio of the coil.

Figure 3:
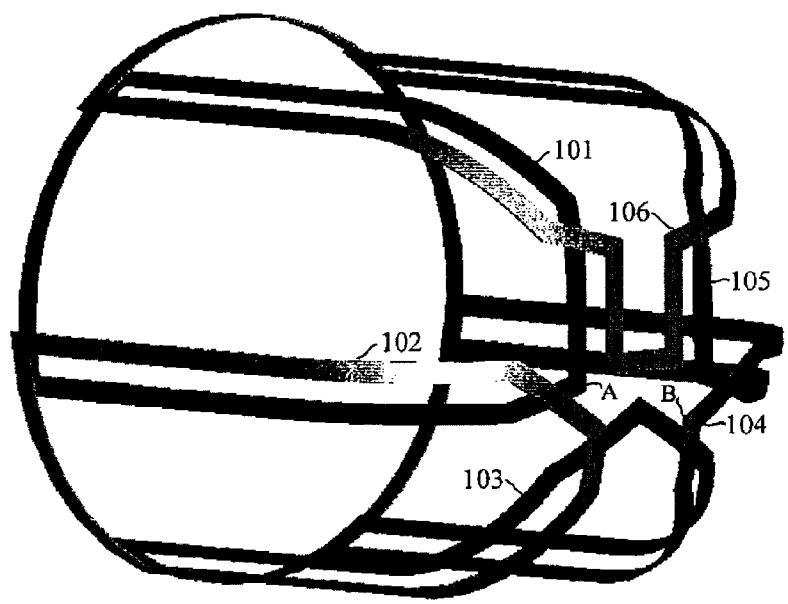
FIG. 3 is a schematic view of a third decoupling mode in an embodiment of the present invention, in which the coil units are collected at one end face of the coil.

FIG. 3 shows a schematic view of and embodiments for collecting these coil units 101-106 of the coil shown in FIG. 1 at an axial end face thereof. In this end face, the coil units that are neither adjacent coil units nor next-adjacent coil units (for example, the coil units 101 and 104, 102 and 105, 103 and 106) are collected together, and are connected at the collecting positions with each other, by a capacitance circuit or an inductance circuit. For example, a point A on the coil unit 101 and a point B on the coil unit 104 are connected to each other, and are connected with a capacitance circuit or an inductance circuit.

Figure 4A:
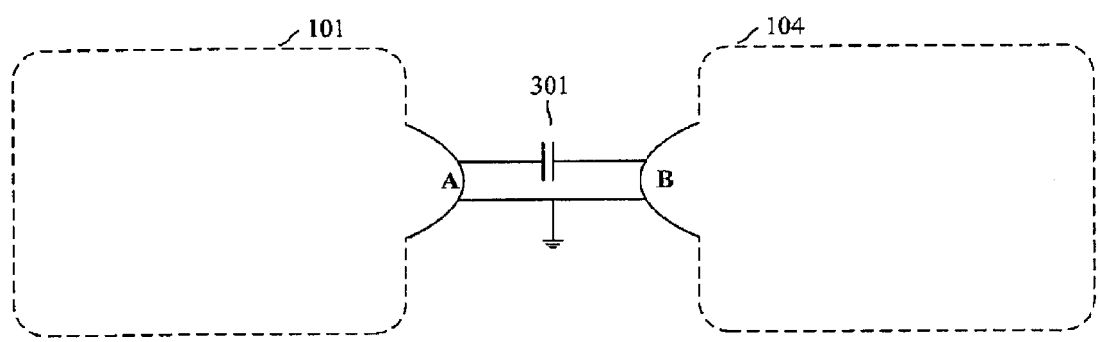
FIG. 4a is a schematic view of the connection of a capacitance circuit.
Figure 4B:
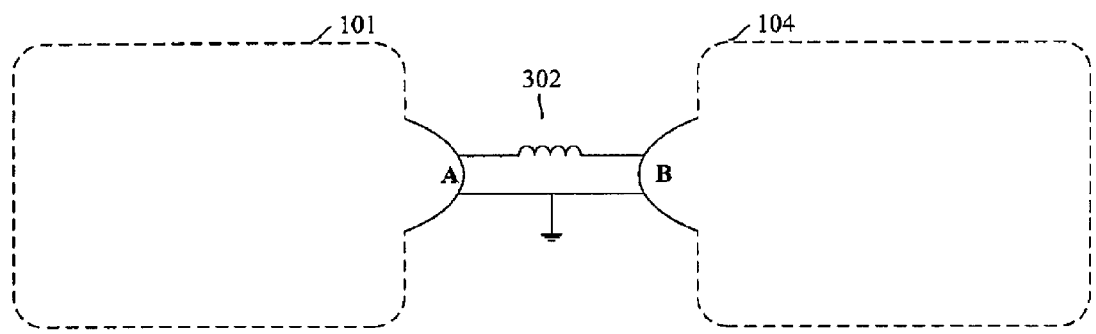
FIG. 4b is a schematic view of the connection of an inductance circuit.

FIG. 4a is a schematic view of a commonly used capacitance circuit and its connection, FIG. 4b is a schematic view of a commonly used inductance circuit and its connection. FIGS. 4a and 4b, coil units 101 and 104 are schematically drawn, and the portions of the coil unit at the side and at the end face of the coil are distinguished from each other by dashed lines and solid lines, FIGS. 4a and 4b are used only to express the connection mode of the capacitance circuit 301 and the inductance circuit 302, and they are not to limit the specific shape of the coil units. In FIGS. 4a and 4b, the capacitance circuit 301 and the inductance circuit 302 are connected in series between the point A of the coil unit 101 and the point B of the coil unit 104. In this case, the capacitance circuit 301 comprises a capacitor and a grounding wire, and the inductance circuit 302 comprises an inductor and a grounding wire. Here, only common connection modes are given, those skilled in the art can use, between the connection points A, B provided in the present invention, other capacitance circuits, inductance circuits and corresponding connection modes known by those skilled in the art, and the present invention is not limited to these modes.

In addition to the above three decoupling modes, the present invention can also have a piece of sheet made of a diamagnetic material arranged on the above-mentioned end face. The diamagnetic material used can be gold, silver, lead or copper, etc. Copper is preferable, because the price of copper is low, its mass is light, and it is easy to fabricate. The shape of the sheet is generally circular, it should be noted that the generally "circular" shape described in the present invention is not limited exactly to a geometrically circular shape, but also includes shapes similar to a circle, for example, a polygon such as a pentagon, hexagon, heptagon, etc. and ellipse etc. The area of the sheet can be an area less than or equal to the area of the end face (the area of cross section of the coil), and preferably it is approximately one half of the area of the end face (the area of cross section of the coil). The position of the sheet is located at the central portion of the end face of the coil. This sheet can change the distribution of the electromagnetic field at the end face of the coil, so that it can improve the signal-to-noise ratio at the end face of the coil.

Moreover, the coil of the present invention can make use of the preamplifier decoupling of the type known in the prior art to further assist decoupling. Since preamplifier decoupling is well known to those skilled in the art, it need not be described in detail herein.

Figure 5:
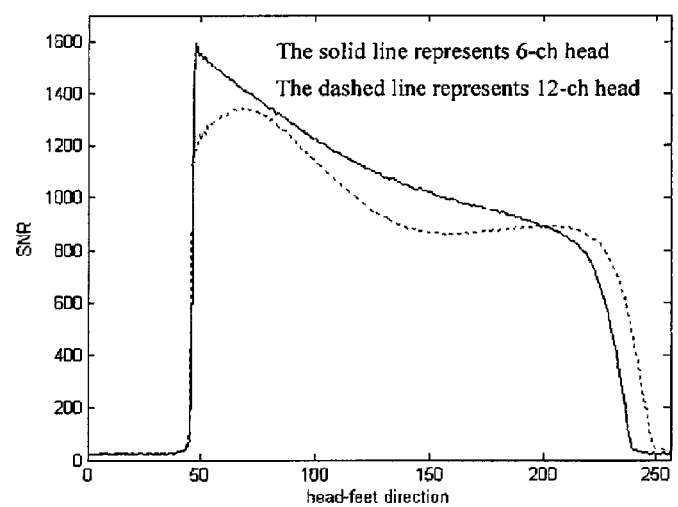
FIG. 5 is the graph of the curves of signal-to-noise ratio of the SOS (Sum of Square) synthesized images of a 6-channel coil and a 12-channel coil.
Figure 6:
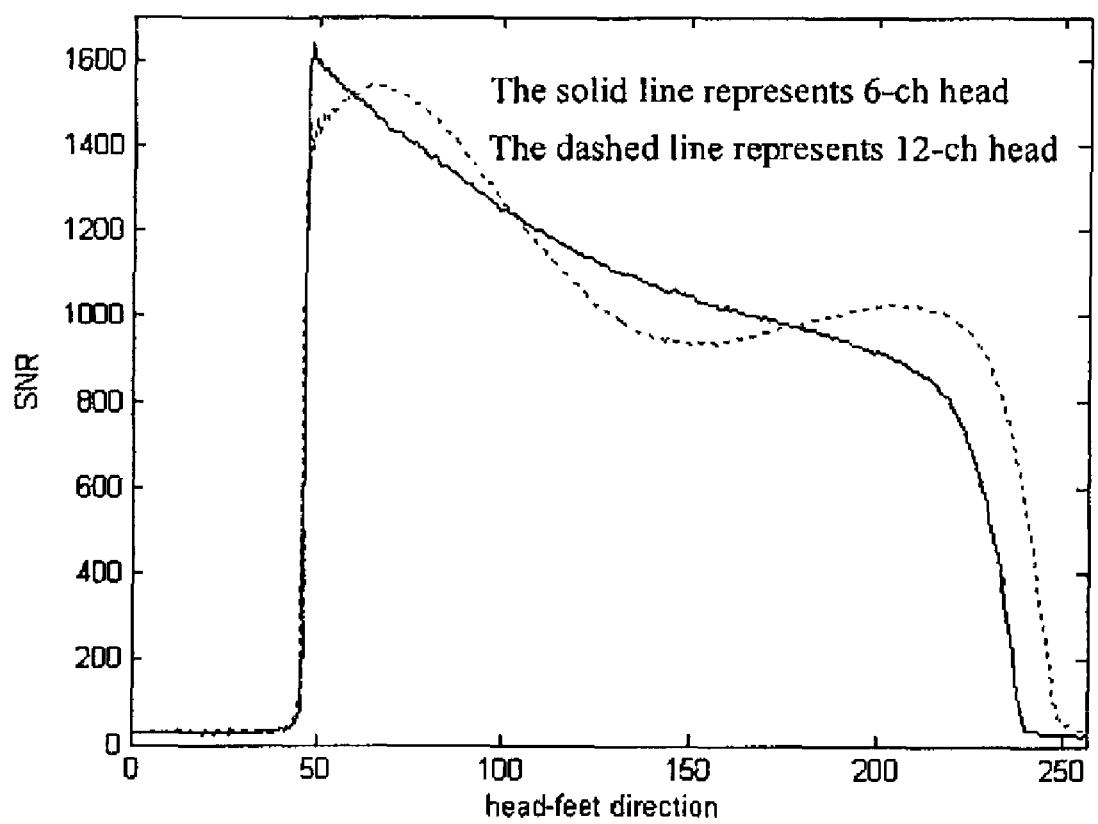
FIG. 6 is the graph of the curves of signal-to-noise ratio of the optimally (OPT) synthesized images of the abovementioned 6-channel coil and 12-channel coil.

FIG. 5 is a screen-captured from a computer showing the signal-to-noise ratio curves of the images synthesized by the SOS method from a 6-channel coil and a 12-channel coil. FIG. 6 is a screen-capture from a computer showing the signal-to-noise ratio curves of the images synthesized by the OPT method from the abovementioned 6-channel coil and 12-channel coil. In FIGS. 5 and 6, horizontal coordinates represent 256 pixels in the head-feet direction, while vertical coordinates represent the signal-to-noise ratio.

In this case, the 6-channel coil is a head coil using the abovementioned three decoupling modes of the embodiment of the present invention. The 12-channel coil is a head coil using the decoupling modes in the prior art, wherein, the first decoupling mode of the prior art is used for the adjacent coil units. Moreover, for non-adjacent coil units in the 6-channel coil and the 12-channel coil, the preamplifier decoupling method is used in addition.

According to the common knowledge of those skilled in the art, a perfect signal-to-noise ratio of the 12-channel coil should be 10% greater than the signal-to-noise ratio of the 6-channel coil, but it can been seen from the signal-to-noise ratio of the image synthesized by SOS in FIG. 5 that, the signal-to-noise ratio of the 6-channel coil using the embodiment of the present invention is on the contrary 10% greater than the signal-to-noise ratio of the 12-channel coil using the prior art. This shows that the coil structure and the decoupling mode of the embodiment of the present invention is much better than that in the prior art, the decoupling is very thorough, thus reducing the noises generated by coupling, and obtaining a better signal-to-noise ratio.

Theoretically speaking, if there is no loss in the coil itself, the 12-channel coil would have a much better signal-to-noise ratio than that of the 6-channel coil when synthesized by OPT, but the results shown in FIG. 6 indicate the difference between them is not substantial. This is because the decoupling of the 6-channel coil using the technical solution of the embodiment of the present invention is thorough, and the influence produced due to the coupling between coil units on the matching of coils is eliminated, allowing the preamplifier to operate with an optimal noise coefficient and so as to achieve a very good signal-to-noise ratio. By contrast, the decoupling of the 12-channel coil using the prior art is not thorough, and the coupling between coil units produces certain influences on the matching of the coil, causing the preamplifier not to operate with an optimal noise coefficient.

Although modifications and changes may be suggested by those skilled in the art, it is the intention of the inventors to embody within the patent warranted hereon all changes and modifications as reasonably and properly come within the scope of their contribution to the art.

We claim:

1. A volume coil assembly for a magnetic resonance imaging system comprising:
    a plurality of coil units configured to form a volume coil for transmitting or receiving radio-frequency signals in a magnetic resonance imaging system;
    two adjacent ones of said coil units having respective overlapped portions that eliminate coupling between said two adjacent ones of said coil units;
    two next-adjacent ones of said coil units, that are separated from each other in said volume coil by one coil unit therebetween, each having an inductor connected therein, and said two inductors being coupled with each other to eliminate coupling between said two next-adjacent coil units; and
    all of said coil units being collected at one axial end face of said volume coil, and two of said coil units in said plurality of coil units, which are neither said adjacent ones of said coil units nor said next-adjacent ones of said coil units, being connected with each other at said end face, by a connecting circuit selected from the group consisting of capacitance circuits and inductance circuits, that eliminates coupling between said two coil units that are neither said adjacent ones of said coil units nor said next-adjacent ones of said coil units.

2. A volume coil assembly as claimed in claim 1 wherein each of said adjacent ones of said coil units has a coil edge that is closest to a coil unit of said next-adjacent ones of said coil units, and wherein the inductor in each of said adjacent ones of said coil units is located in the coil edge thereof.

3. A volume coil assembly as claimed in claim 1 wherein said connecting circuit is connected in series between said two coil units that are neither said adjacent ones of said coil units nor said next-adjacent ones of said coil units.

4. A volume coil assembly as claimed in claim 3 wherein said connecting circuit is a capacitance circuit comprising a capacitor.

5. A volume coil assembly as claimed in claim 3 wherein said connecting circuit is an inductance circuit comprising an inductor.

6. A volume coil assembly as claimed in claim 1 comprising a sheet comprised of dielectric material located at said end face.

7. A volume coil assembly as claimed in claim 6 wherein said dielectric material is selected from the group consisting of copper, gold, silver and lead.

8. A volume coil assembly as claimed in claim 6 wherein said sheet has a generally circular shape and is located in a central portion of said end face, said sheet having an area that is approximately one-half of an area of said end face.

* * * * *